United States Patent [19]

Koyama

[11] Patent Number: 4,538,232
[45] Date of Patent: Aug. 27, 1985

[54] ELECTRON-BEAM LITHOGRAPHIC APPARATUS

[75] Inventor: Kiyomi Koyama, Yokohama, Japan

[73] Assignee: Tokyo Shibaura Denki Kabushiki Kaisha, Kawasaki, Japan

[21] Appl. No.: 370,403

[22] Filed: Apr. 21, 1982

[30] Foreign Application Priority Data

Apr. 30, 1981 [JP] Japan .................................. 56-65912

[51] Int. Cl.³ ........................ G06F 15/40; G21G 5/00; G21K 5/00
[52] U.S. Cl. ................................. 364/491; 250/492.2; 250/492.3; 364/518
[58] Field of Search ............... 364/468, 490, 491, 489, 364/518, 520, 521; 382/25, 26, 30, 8, 34, 48; 430/296, 942, 949; 250/492.1–492.3

[56] References Cited

U.S. PATENT DOCUMENTS

| | | | |
|---|---|---|---|
| 3,631,406 | 12/1971 | Kurner | 364/200 |
| 3,881,098 | 4/1975 | Rich | 364/490 |
| 4,063,103 | 12/1977 | Sumi | 250/442.1 |
| 4,259,724 | 3/1981 | Sugiyama | 364/491 |
| 4,387,433 | 6/1983 | Cardenia et al. | 364/491 |
| 4,433,384 | 2/1984 | Berrian et al. | 250/492.2 |

OTHER PUBLICATIONS

Journal of Vacuum Science and Technology; vol. 5, No. 3, 1978, pp. 874–877; A. M. Patlach et al.

Primary Examiner—James D. Thomas
Assistant Examiner—Dale M. Shaw
Attorney, Agent, or Firm—Oblon, Fisher, Spivak, McClelland & Maier

[57] ABSTRACT

A coordinate data memory is provided, in which a plurality of coordinate data representing partial patterns constituting a pattern to be drawn on a semiconductor wafer are stored. The coordinate data are supplied from the coordinate data memory to a plurality of coordinate data converters. The data converters convert coordinate data into address data by which pattern memories are specified respectively. Bit patterns are formed according to the address data in the pattern memories, respectively. The bit patterns of the pattern memories are synchronously read out bit by bit and synthesized in a logic gate circuit, and the resultant pattern is supplied to a blanking circuit bit by bit.

7 Claims, 10 Drawing Figures

ELECTRON-BEAM LITHOGRAPHIC APPARATUS

BACKGROUND OF THE INVENTION

This invention relates to electron-beam lithographic apparatus and, more particularly, to electron-beam lithographic apparatus for drawing fine patterns on such objects as semiconductor wafers and mask substrates.

Hitherto, various electron-beam lithographic apparatus have been used for the manufacture of IC devices. These electron-beam lithographic apparatus include a table carrying a silicon wafer which is moved in a regular raster scan pattern while an electron beam scans the silicon wafer in a direction perpendicular to the direction of travel of the table. In this apparatus, rectangular or trapezoidal patterns are converted into digital data consisting of "1"s and "0"s, and the digital data are transmitted as blanking data to a blanking device for on-off controlling the electron beam. However, with the prior art raster scan type electron lithographic apparatus, addresses in which line data corresponding to electron beam scanning lines are calculated from the coordinate data representing the coordinates of the apices of pattern, and a bit pattern is formed in pattern memories for the individual lines. When the bit pattern is formed in a pattern memory, it is read out bit by bit from the pattern memory and supplied to the blanking device. In this system, if the pattern to be drawn is complicated and of a high density, the process of converting the pattern coordinate data into address data is complicated and the time required for the process is increased.

SUMMARY OF THE INVENTION

An object of the invention, accordingly, is to provide an electron-beam lithographic apparatus, which can form bit patterns at a high speed and can thus reduce the time required for drawing patterns.

According to the invention, coordinate data of each of a plurality of partial patterns is stored in a pattern coordinate data memory, and partial pattern coordinate data successively read out from the pattern coordinate data memory are distributed to data converters by a partial pattern coordinate data distributor. Each of the data converters converts the input partial pattern coordinate data into address data for forming a partial pattern. According to the address data of the data converters, bit patterns corresponding to the respective partial patterns are formed in partial pattern memories. The bit patterns formed in the partial pattern data memories are supplied as blanking signals to a blanking circuit through a logic gate as they are synchronously read out by respective pattern data readers. During the reading operation, new partial pattern data are supplied to other partial pattern data memories in the manner as described above.

DETAILED DESCRIPTION OF THE PREFERRED EMBODIMENTS

Figure 1:
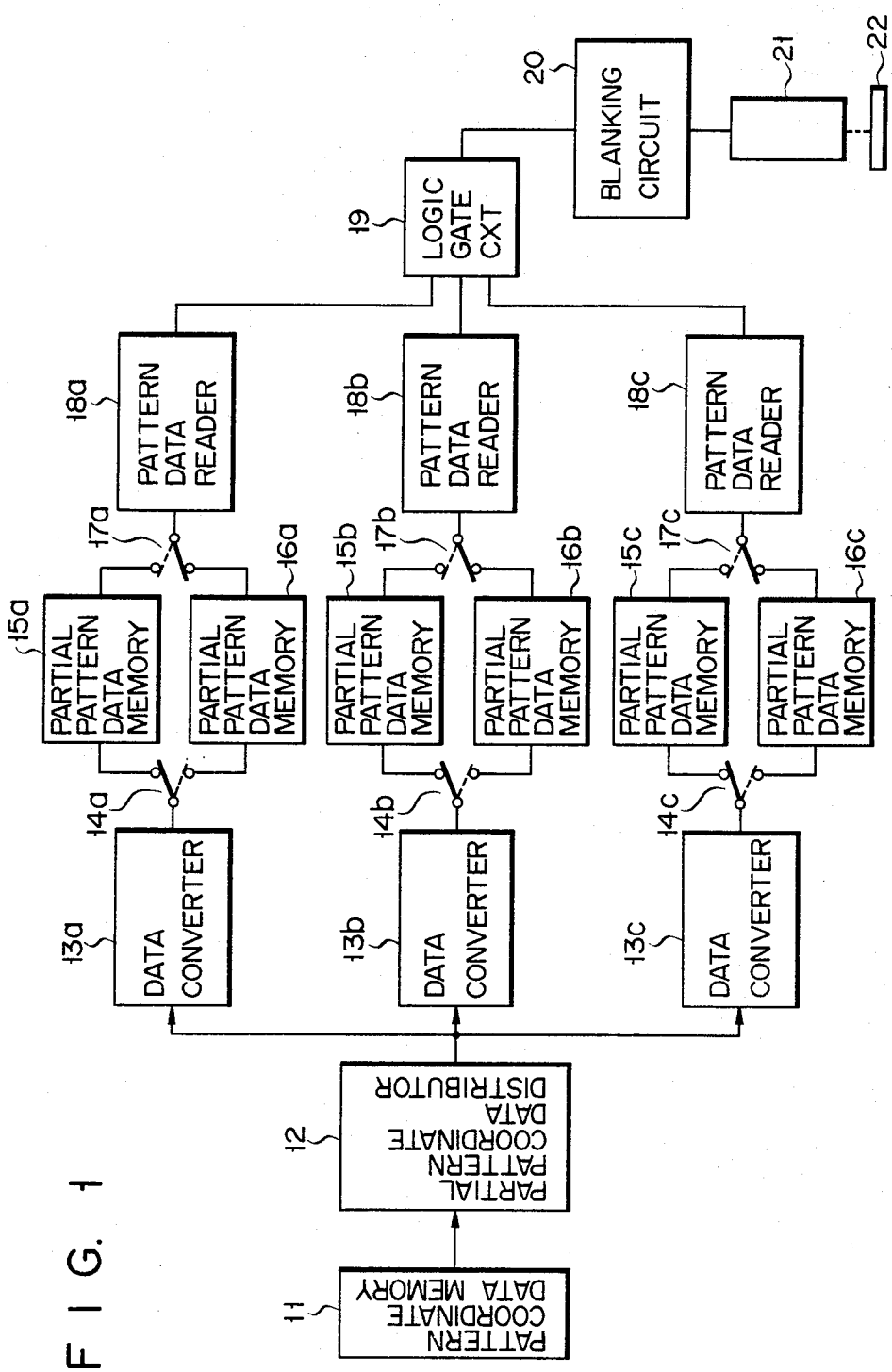
FIG. 1 is a block diagram showing one embodiment of the electron-beam lithographic apparatus according to the invention.

Referring to FIG. 1, partial pattern coordinate data representing the coordinates of partial patterns which constitute a pattern to be drawn is stored in a pattern coordinate data memory 11. The pattern coordinate data memory 11 is connected to an input terminal of a partial pattern coordinate data distributor 12. The output terminal of the partial coordinate data distributor 12 is connected to an input terminal of each of a plurality of data converters 13a, 13b and 13c. The output terminals of the data converters 13a, 13b and 13c are connected to respective common terminals of electronic switches 14a, 14b and 14c. The electronic switches 14a, 14b and 14c have their switching terminals connected to input terminals of partial pattern memories 15a and 16a, 15b and 16b and 15c and 16c respectively. The output terminals of partial pattern memories 15a to 16c are connected through electronic switches 17a to 17c to input terminals of pattern data readers 18a to 18c. The output terminals of the pattern data readers 18a to 18c are connected to respective input terminals of a logic gate circuit 19, and the output terminal thereof is connected to an input terminal of the blanking circuit 20. The output terminal of the blanking circuit 20 is connected to a beam blanking member of an electron-beam lithography unit 21.

Figure 2:
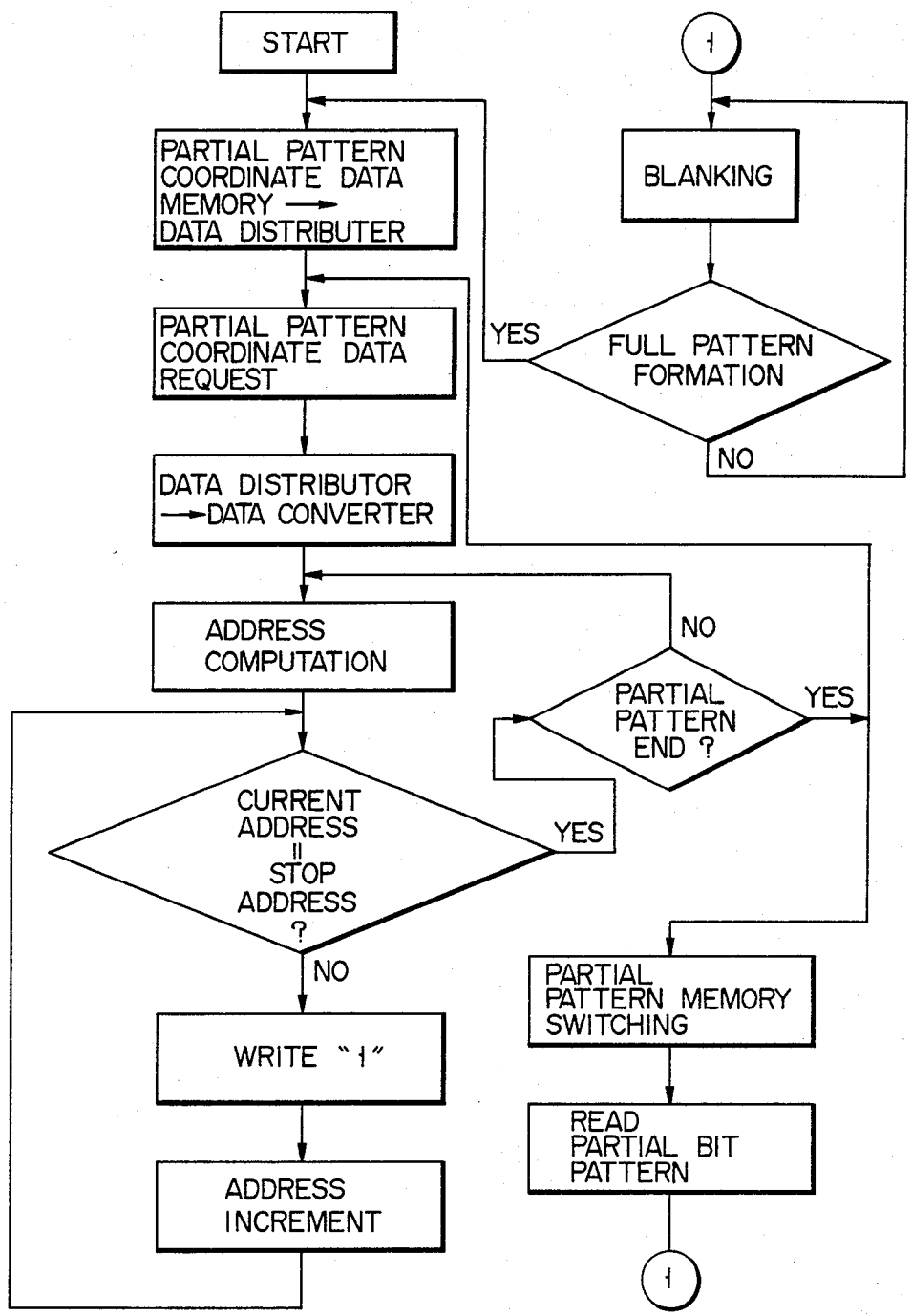
FIG. 2 is a flow chart explaining the operation of the electron-beam lithographic apparatus of FIG. 1.

The operation of the electron-beam lithographic apparatus will now be described with reference to the flow chart of FIG. 2.

Figure 3:
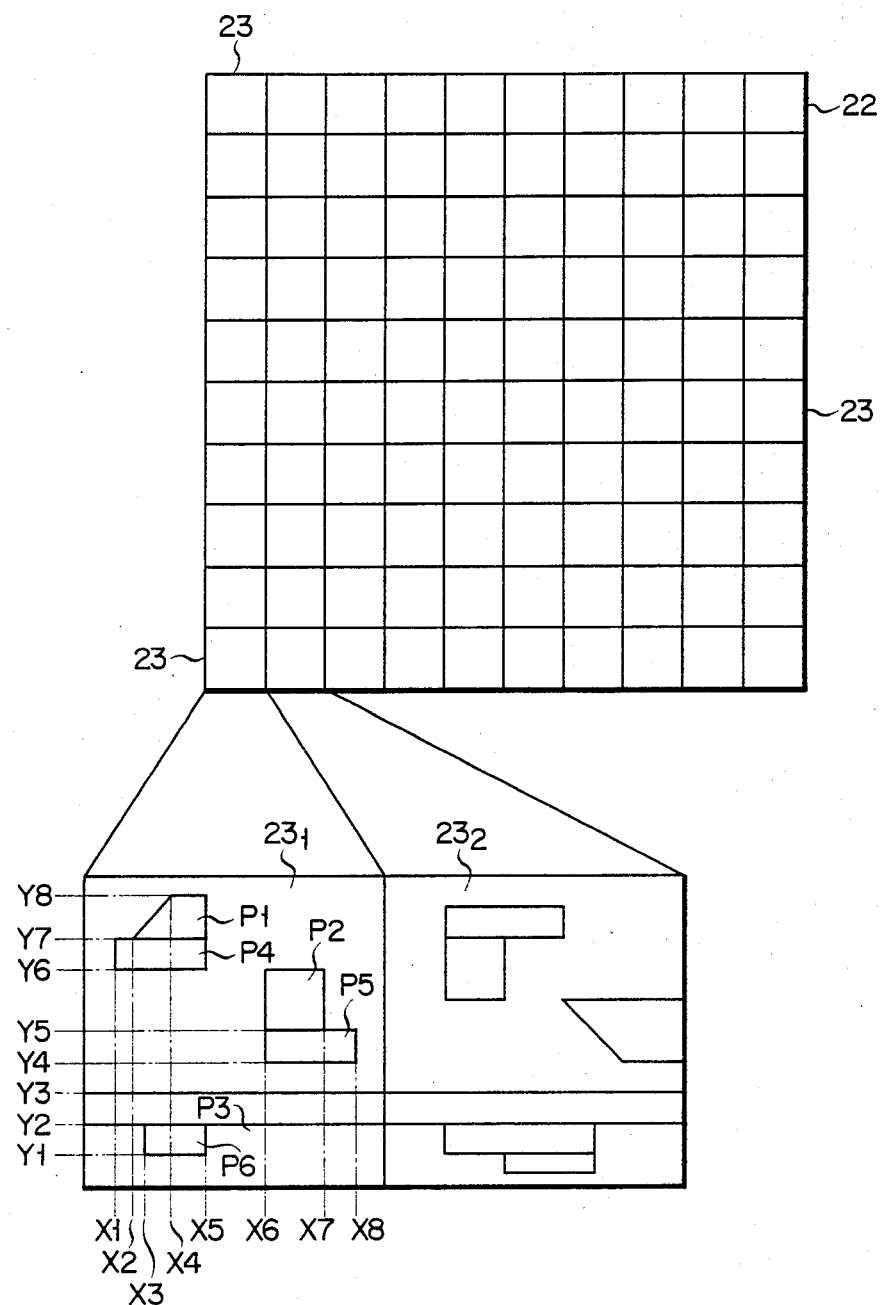
FIG. 3 is a plan view of a semiconductor wafer on which patterns are drawn and sections of the wafer with patterns drawn thereon.

When a pattern drawing start is made, partial pattern coordinate data stored in the partial pattern coordinate data memory 11 is transferred to the pattern coordinate data distributor 12. The partial pattern coordinate data will be described in the following. When drawing a certain pattern, for instance an IC pattern, on a semiconductor (silicon) wafer 22 as shown in FIG. 3, the wafer 22 is divided into $10 \times 10$ sections 23, and the drawing is effected progressively for a section after another. A pattern to be drawn in, for instance a section $23_1$, is divided into a plurality of partial patterns P1 to P6, and coordinates are set for the individual partial patterns P1 to P6. More particularly, the partial pattern P1 is represented by coordinates (X2, Y7), (X4, Y8), (X5, Y7) and (X5, Y8). Likewise, the partial pattern P2 is represented by coordinates (X6, Y5), (X6, Y6), (X7, Y5) and (X7, Y6). In this way, the coordinates for the other partial patterns P3 to P6 are also determined. These coordinates are encoded, and the resultant codes are progressively stored as partial pattern coordinate data for the individual partial patterns in the memory 11. The coordinates of partial patterns for the other sections $23_2, \ldots$ are also determined, and their data are also stored in the memory 11.

Figure 4:
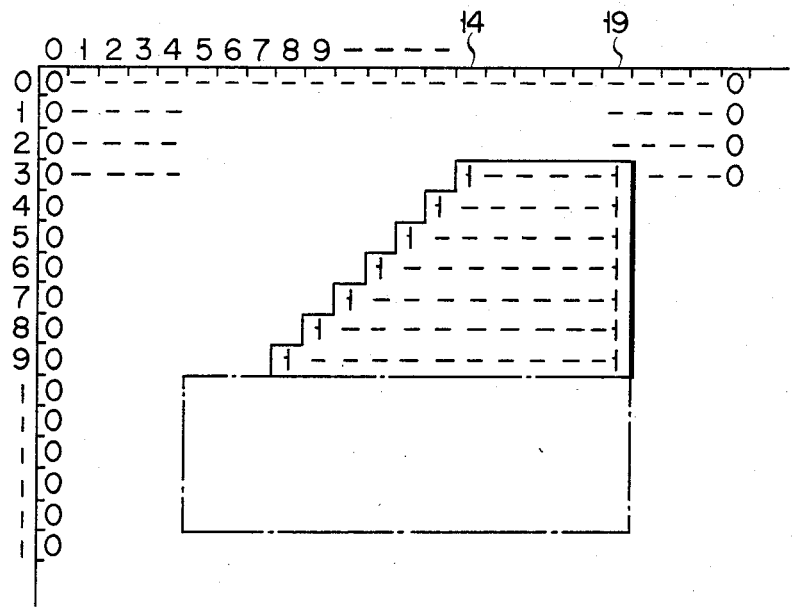
FIG. 4 is a view showing a bit partial pattern formed in a partial pattern memory shown in FIG. 1.
Figure 5:
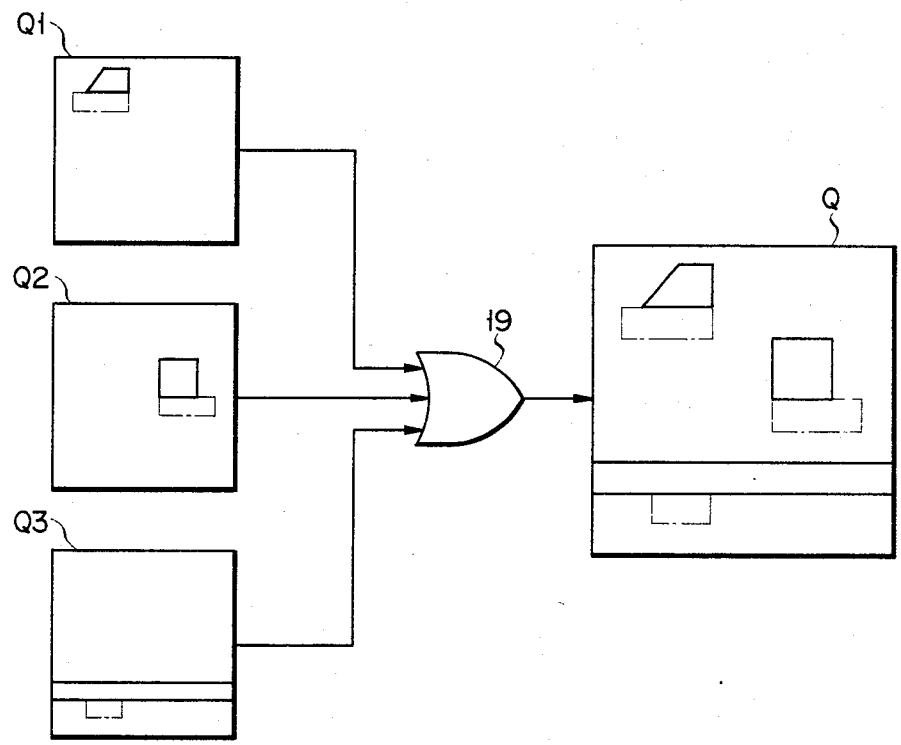
FIG. 5 is a view showing the way of forming a bit pattern from bit partial patterns.

The pattern coordinate data distributor 12 as mentioned above distributes the partial pattern data supplied from the memory 11 to the data converters 13a to 13c according to data request from these data converters. The data converters 13a to 13c each perform address computation for reproducing partial patterns in the partial pattern data memories 15a to 15c from the coordinate data. At this time, for reproducing, for instance, the bit pattern corresponding to the partial pattern P1 in the partial pattern data memory 15a from the coordinate data of the partial pattern P1, addresses corresponding to the coordinates (X4, Y8) and (X5, Y8) of the apices of the partial pattern P1 are obtained. In FIG. 4, the addresses corresponding to the aforementioned apices of the partial pattern P1 are given as (3, 14) and (3, 19), respectively. The address (3, 14) is determined as an initial address or current address, and it is compared with the address (3, 19) which is determined as a stop address. If both the addresses do not coincide, "1" is written in the current address (3, 14). Then, the current address is incremented to update the address. The updated current address (3, 15) is compared with the stop address (3, 19), and "1" is written in the updated current address (3, 15). When a line pattern for one line is formed with the writing of "1"s in the successive addresses up to the stop address (3, 19), whether this line pattern is the last line pattern, i.e., the end of the partial pattern, is checked. Since the result of this check is NO at this moment, the addresses for the next line pattern are subsequently computed. At this time, the initial address (4, 13) of the next line pattern is derived from the tangent value of the inclination angle of the inclined side of the partial pattern P1. When the initial address (4, 13) is determined, "1"s are written in the addresses from the initial address (4, 13) to the stop address (3, 19) in the manner as described above. In this way, the second line pattern is formed. Likewise, "1"s for the line patterns up to the last line pattern are written in the memory 15a, whereby the bit pattern corresponding to the partial pattern P1 is formed in the partial pattern data memory 15a. The other partial patterns P2 and P3 are stored as respective bit patterns in the respective partial pattern data memories 15b and 15c by the data converters 13b and 13c. The partial patterns P1 to P3 stored in the memories 15a to 15c are shown as patterns Q1 to Q3 in FIG. 5. When the end of the patterns Q1 to Q3 is detected, the electronic switches 14a to 14c and 17a to 17c are switched, to the state as shown by dashed lines in FIG. 1 to connect the data converters 13a to 13c to the respective partial pattern data memories 16a to 16c and also connect the partial pattern data memories 15a to 15c to the respective pattern data readers 18a to 18c. The bit patterns in the partial pattern data memories 15a to 15c are read out in bit serial synchronism by the pattern data readers 18a to 18c and are supplied through the logic gate circuit 19 to the blanking circuit 20. Meanwhile, bit patterns corresponding to the partial patterns P4 to P6 are formed in the partial pattern memories 16a to 16c by the data converters 13a to 13c. The bit patterns corresponding to the partial patterns P4 to P6 are shown by dot and bar lines in FIG. 5. When the bit patterns corresponding to the partial patterns P4 to P6 are completely formed in the partial pattern data memories 16a to 16c and also the bit patterns corresponding to the partial pattern data memories 15a to 15c are completely read out, the electronic switches 14a to 14c and 17a to 17c are switched again, and the bit patterns in the partial pattern memories 16a to 16c are synchronously read out by the pattern data readers 18a to 18c and supplied through the logic gate circuit 19 to the blanking circuit 20. In this way, data representing the bit patterns of the composite pattern constituted by the partial patterns P1 to P6, i.e., the pattern Q shown in FIG. 5, is supplied to the blanking circuit 20, and on the basis of this pattern Q the blanking circuit 20 effects blanking control of the electron-beam lithography unit 21. Thus, the pattern Q is drawn in the first section $23_1$ of the semiconductor wafer 22. When it is detected that the pattern in the first section has been entirely formed, coordinate data for the second section $23_2$ is read out from the partial pattern coordinate data memory 11 and supplied to the data distributor 12 for forming pattern in the second section $23_2$. Then, the pattern of the second section $23_2$ is formed on the semiconductor wafer 22 in the manner as described above in connection with the first section $23_1$.

As has been shown, in the above embodiment a plurality of data converters are operated in a parallel fashion to form a plurality of partial patterns on memories according to coordinate data supplied from a pattern coordinate memory according to request, while during this writing operation partial patterns having previously been formed in other memories are read out and synthesized by an OR gate to form a single pattern. With this electron-beam lithographic apparatus even though the pattern formation time may vary depending upon the shape of the pattern, since it is possible for coordinate data to be immediately distributed to a vacant data converter, effective pattern formation can be obtained with reduced process time. Further, since the writing and reading of data are simultaneously carried out, no stand-by period is involved, and thus the processing speed can be improved.

Figure 6:
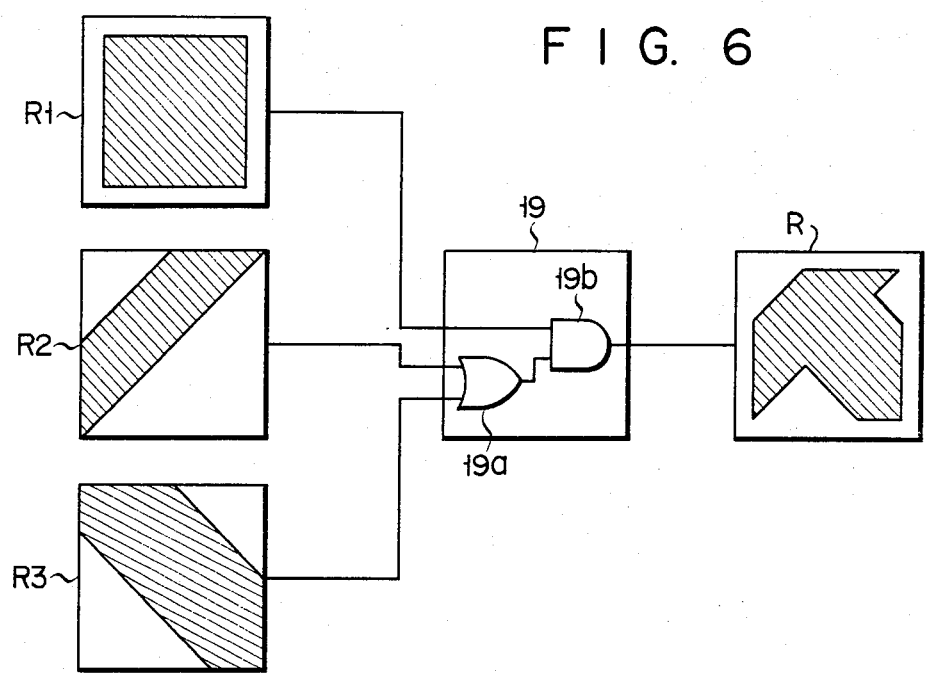
FIGS. 6 and 7 are views showing examples of formation of a composite bit pattern from bit partial patterns.
Figure 7:
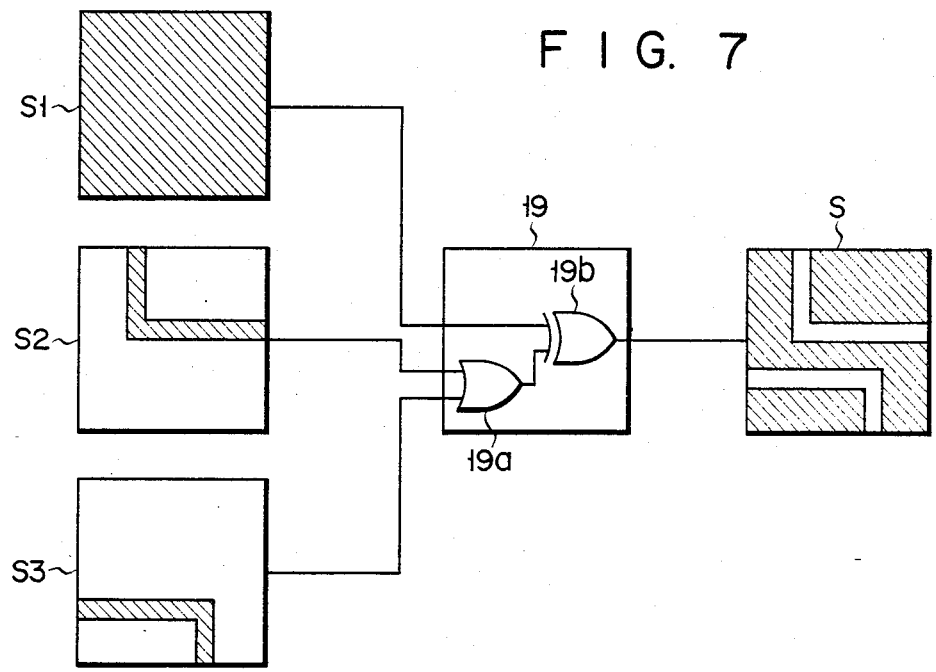

Further, while in the above embodiment partial patterns are synthesized by an OR gate, it is possible to obtain processing for various patterns by replacing the OR gate with other logic gates. In an example shown in FIG. 6, of patterns R1, R2 and R3 formed in respective pattern memories the patterns R2 and R3 are synthesized by an OR gate 19a of a logic gate circuit 19, and the resultant pattern R23 (not shown) and the pattern R1 are coupled to an AND gate 19b to form a pattern R. In this example, considerably complicated patterns can be simply formed from fixed patterns. In an example shown in FIG. 7, patterns S2 and S3 are synthesized by an OR gate 19a of a logic gate 19, and the resultant pattern S23 (not shown) and a pattern S1 are coupled to an exclusive OR gate 19b to obtain a resultant pattern S.

Figure 8:
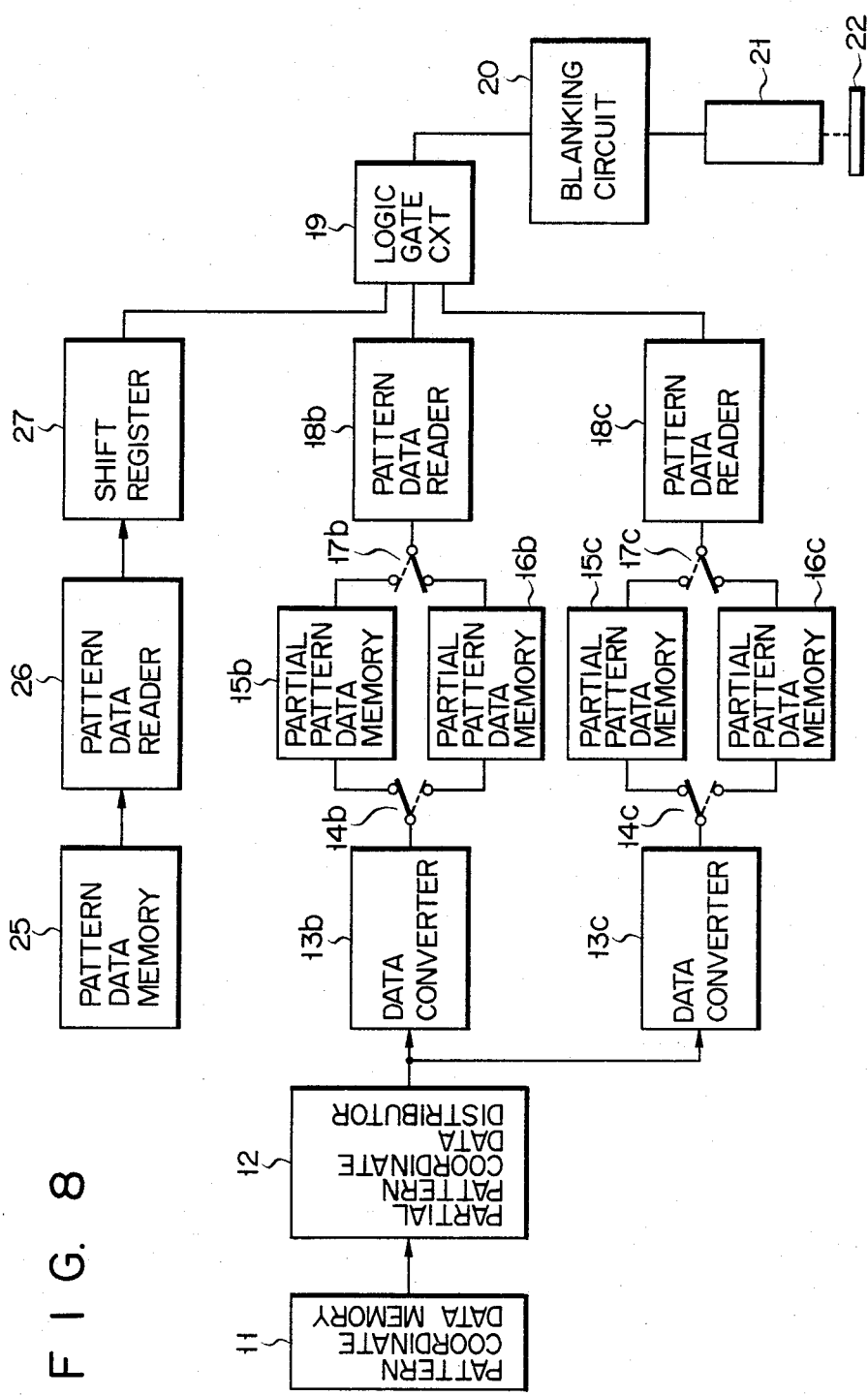
FIG. 8 is a block diagram showing a different embodiment of the electron-beam lithographic apparatus according to the invention.
Figure 9:
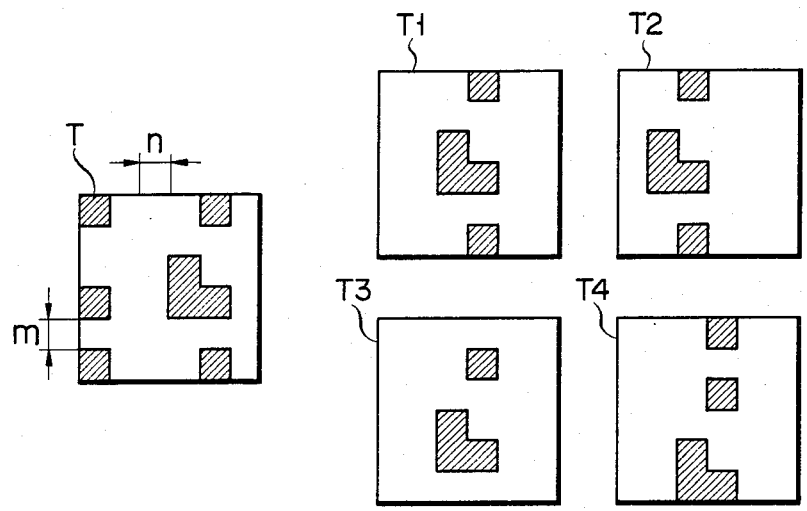
FIG. 9 is a view showing a bit pattern of a fixed pattern data memory.
Figure 10:
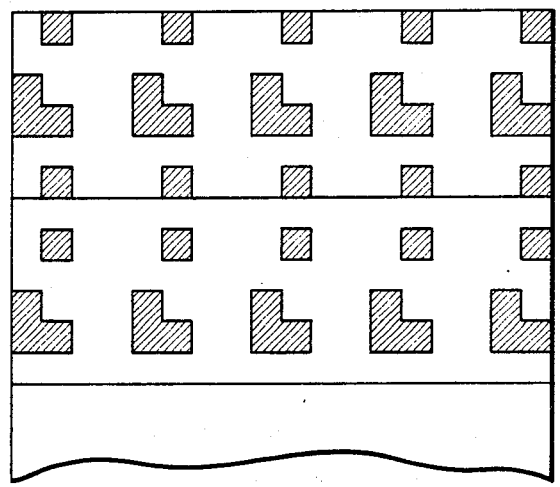
FIG. 10 is a view showing a pattern drawn by repeatedly using the bit pattern shown in FIG. 9.

While in the above examples different patterns have been combined, it is often in practice in the formation of IC patterns to use a single pattern repeatedly for obtaining a desired pattern. Such an example will be described with reference to FIGS. 8 and 9. In the electron-beam lithographic apparatus shown in FIG. 8, there is provided a pattern data memory 25, in which a bit pattern corresponding to a fixed pattern T as shown in FIG. 9 is stored. The pattern data of this pattern data memory 25 is read out by a pattern data reader 26 and transferred to a shift register 27. In the shift register 27, the bit pattern T transferred is shifted n bits in the X-direction and m bits in the Y-direction, if necessary. Thus, the shift register 27 provides bit patterns T1, T2, T3 and T4. These bit patterns T1 to T4 are combined with bit patterns from pattern data readers 18b and 18c in a logic gate circuit 19 to obtain a pattern including a recurring fixed pattern as shown in FIG. 10.

As has been described in the foregoing, with the electron-beam lithographic apparatus according to the invention, a plurality of partial patterns are formed in a parallel fashion in respective pattern memories, and the partial pattern data of these pattern memories are synchronously read out and synthesized in a synthesis circuit to obtain a composite pattern data which is supplied to a blanking circuit to form a predetermined pattern on an object, for instance a semiconductor wafer. With this apparatus, in which a plurality of patterns are simultaneously processed, that is, a multiplex data processing is performed, the speed of drawing a single pattern is extremely increased. Further, since new partial pattern data is written while previously written partial pattern data is being read out, no loss time is involved between the writing and reading, so that drawing speed can be further improved.

What is claimed is:

1. An electron-beam lithographic apparatus comprising:

means for generating address data corresponding to a plurality of partial patterns in parallel;

pattern memory means specified in parallel by the address data from said address data generating means for forming bit patterns corresponding to said partial patterns in parallel;

means for synchronously reading out in parallel said bit patterns from said memory means;

means for synthesizing said bit patterns read out in parallel by said reading means to produce a resultant bit pattern in the form of bit data; and means for effecting blanking of an electron beam according to the bit data from said synthesizing means to thereby draw a pattern on an object;

wherein said pattern memory means is constituted by a plurality of pair memories, and one bit pattern is formed in one memory in each of said pair memories while previously written bit pattern is being read out from the other memory in each of said pair memories.

2. An electron-beam lithographic apparatus according to claim 1, wherein said address data generating means includes coordinate data memory means in which coordinate data of partial patterns of a pattern to be drawn are stored, and data converting means for being supplied with coordinate data of said coordinate memory means for one partial pattern and converting said coordinate data into the respective address data.

3. The electron-beam lithographic apparatus according to claim 1, wherein said synthesizing means is constituted by an OR gate for being supplied with bit patterns from said reading means.

4. The electron-beam lithographic apparatus according to claim 1, wherein said synthesizing means includes an OR gate for being supplied with the bit patterns from said reading means and an AND gate for being supplied with an output bit pattern from said OR gate and at least one fixed bit pattern.

5. The electron-beam lithographic apparatus according to claim 1, wherein said synthesizing means includes an OR gate for being supplied with the bit patterns from said reading means and an exclusive OR gate for being supplied with an output bit pattern from said OR gate and at least one fixed bit pattern.

6. The electron-beam lithographic apparatus according to claim 1, which further comprises means for generating a fixed bit pattern and means for repeatedly supplying the fixed bit pattern from said fixed bit pattern generating means to said synthesizing means.

7. An electron-beam lithographic apparatus, comprising:

a main memory for storing a plurality of partial patterns;

a data distributor connected to said memory for distributing said partial patterns from said memory;

a plurality of parallel data converters for receiving said partial patterns from said data distributor;

a plurality of pairs of parallel pattern memories, each of said pairs being connected to a corresponding one of said data converters;

a plurality of pattern data readers, each of said readers being connected to a corresponding pair of pattern memories for receiving a partial pattern therefrom;

a first pattern memory of each pair being connected to a data converter while a second pattern memory of each pair is connected to said data reader, said pattern memories alternating connections so that each pattern memory alternately receives and stores a partial pattern from said data converter and reads out said partial pattern to said data reader;

a logic gate circuit for receiving a plurality of partial patterns from said plurality of data readers logically combining said partial patterns to form a complete pattern;

a blanking circuit connected to said logic gate circuit for blanking an electron beam according to said complete pattern.

* * * * *